United States Patent
Kezuka et al.

[11] Patent Number: 6,159,865
[45] Date of Patent: Dec. 12, 2000

[54] WAFER TREATING SOLUTION AND METHOD FOR PREPARING THE SAME

[75] Inventors: Takehiko Kezuka; Makoto Suyama; Fumihiro Kamiya; Mitsushi Itano, all of Settsu, Japan

[73] Assignee: Daikin Industries, Ltd., Osaka, Japan

[21] Appl. No.: 09/523,216

[22] Filed: Mar. 10, 2000

Related U.S. Application Data

[62] Division of application No. 09/051,492, Apr. 22, 1998, Pat. No. 6,068,788.

[51] Int. Cl.$^7$ .................. H01L 21/302; C09K 13/00; C09K 13/04; C09K 13/08; C09K 13/06
[52] U.S. Cl. .................. 438/745; 252/79.1; 252/79.2; 252/79.3; 252/79.4
[58] Field of Search .................. 438/745; 252/79.1, 252/79.2, 79.3, 79.4

[56] References Cited

U.S. PATENT DOCUMENTS

| | | | |
|---|---|---|---|
| 4,055,458 | 10/1977 | Niederprum et al. | 216/97 |
| 4,517,106 | 5/1985 | Hopkins et al. | 252/79.4 |
| 5,132,038 | 7/1992 | Kukanskis et al. | 510/175 |
| 5,277,835 | 1/1994 | Ohmi et al. | 252/79.3 |
| 6,068,788 | 5/2000 | Kezuka et al. | 252/79.1 |

FOREIGN PATENT DOCUMENTS 6-41770  2/1994  Japan .

OTHER PUBLICATIONS

Saito, et al., English Abstract of JP-A-7-045-600, Feb. 14, 1995.
Saito, et al., English Abstract of JP-A-6-084,866, Mar. 25, 1994.

*Primary Examiner*—William Powell
*Assistant Examiner*—Lynette T. Umez-Eronini
*Attorney, Agent, or Firm*—Arent Fox Kintner Plotkin & Kahn, PLLC

[57] ABSTRACT

The present invention provides a wafer treating solution in which at least one of $C_nH_{2n+1}ph(SO_3M)Oph(SO_3M)$ wherein ph is a phenylene group, n is 5 to 20, and M is a hydrogen or salt; $C_nH_{2n+1}phO(CH_2CH_2O)mSO_3M$ wherein ph is a phenylene group, n is 5 to 20, m is 0 to 20, and M is a hydrogen or salt; and $C_nH_{2n+1}O(CH_2CH_2O)mSO_3M$ wherein n is 5 to 20, m is 0 to 20, and M is a hydrogen or salt, is dissolved in 0.1 to 1000 ppm into a 20 to 60 wt % of hydrogen fluoride (HF), and the remainder is water (100 wt % in total), and a method for preparing a low concentration of wafer treating solution by adding water, $H_2O_2$, $HNO_3$, $CH_3COOH$, $NH_4F$ or the like, into the above solution. The present invention also provides a wafer treating solution in which at least one of surfactants represented by $C_nH_{2n+1}ph(SO_3M)Oph(SO_3M)$ wherein ph is a phenylene group, n is 5 to 20, and M is a hydrogen or salt; $C_nH_{2n+1}phO(CH_2CH_2O)mSO_3M$ wherein ph is a phenylene group, n is 5 to 20, m is 0 to 20, and M is a hydrogen or salt; and $C_nH_{2n+1}O(CH_2CH_2O)mSO_3M$ wherein n is 5 to 20, m is 0 to 20, and M is a hydrogen or salt, is dissolved in 0.01 to 1000 ppm in at least one of HF, $H_2O_2$, $HNO_3$, $CH_3COOH$, $NH_4F$, HCl, $H_3PO_4$ and an ammonium hydroxide represented by a formula:

$$[(R_1)(R_2)(R_3)(R_4)N]^+OH^-$$

wherein $R_1$, $R_2$, $R_3$ and $R_4$ are an alkyl group of 1 to 6 carbon atoms which may have a hydroxyl group as a substitutent, and the remainder is water (100 wt % in total).

14 Claims, No Drawings

WAFER TREATING SOLUTION AND METHOD FOR PREPARING THE SAME

This is a divisional application for U.S. Patent Application Ser. No. 09/051,492, filed on Apr. 22, 1998, now issued as U.S. Pat. No. 6,068,788.

TECHNICAL FIELD

The present invention relates to a treating solution of silicon wafers and a method for preparing the solution. More particularly, the invention relates to a treating solution of silicon wafers which prevents the contamination of the surfaces of the silicon wafers with fine particles, and to a method for preparing the solution.

BACKGROUND ART

In the manufacturing steps of semiconductor integrated circuit devices in which an LSI is formed on a semiconductor substrate (wafer) comprised of a single crystal of silicon, a wet etching using a hydrofluoric acid (HF) solution is employed in patterning an oxide film ($SiO_2$) of the surface of a substrate or in removing a native oxide film that is formed on the surface of the substrate in heat treatment. An etching of the surface of $SiO_2$ is made by using a hydrofluoric acid (HF) aqueous solution or a buffered hydrofluoric acid aqueous solution (HF—$NH_4F$—$H_2O$). An etching of $Si_3N_4$ is made by using a phosphoric acid ($H_3PO_4$) aqueous solution. An etching of the surface of Si is made by using a hydrofluoric acid (HF)-nitric acid ($HNO_3$) aqueous solution or a hydrofluoric acid (HF)-nitric acid ($HNO_3$)-acetic acid ($CH_3COOH$) aqueous solution. When removing a metal adhered to the surface of a substrate in wiring forming steps or the like, a wet cleaning is made by using a hydrofluoric acid (HF) aqueous solution, a hydrofluoric acid (HF)-hydrogen peroxide ($H_2O_2$) aqueous solution, or a hydrochloric acid (HCl)-hydrogen peroxide ($H_2O_2$) aqueous solution. In these wet cleanings, in order to prevent extraneous particles from adhering to the active surface of a substrate after removing the above-mentioned oxide film or metal, it is necessary to retain the cleanliness of an etchant or a cleaning solution by, for example, circulating and filtrating the etchant or cleaning solution.

Meanwhile, such an etchant or cleaning solution is required to have a higher cleanliness as the refinement of integrated circuits is progressed. However, extraneous particles brought into a treating bath tend to increase with increasing wafer process and wafer aperture.

Although techniques of adding a surfactant into the aforementioned treating solutions have been developed, each method has the following problem. That is, even if a surfactant is dissolved until it reaches the saturated solubility, in a high concentration of HF, $H_2O_2$, $HNO_3$, $CH_3COOH$, $NH_4F$, HCl, $H_3PO_4$, or an ammonium hydroxide represented by the formula $[(R_1)(R_2)(R_3)(R_4)N]^+OH^-$ ($R_1$, $R_2$, $R_3$ and $R_4$ are an alkyl group having 1 to 6 carbon atoms which may have a hydroxyl group as a substituent), when it is diluted or mixed with other chemical, the surfactant is thinned and thus fails to obtain the effect of reducing particle adhesion. In the cases where a surfactant is diluted or is added when mixing with other chemical, there are problems that much time is required and, in order to obtain a sufficient reduction effect of particle adhesion, it is necessary to add a large quantities of surfactant, causing severe foaming.

From the viewpoints as stated, the present inventors proposed a method for preventing the contamination of the surfaces of silicon wafers with fine particles by treating with a solution prepared by adding an anionic surfactant or a nonionic surfactant into a low concentration of hydrofluoric acid or the like (JP-A-41770/1994). However, this method was poor in storage and transport efficiencies. It was also unknown whether surfactants disclosed in this publication are dissolved in a high concentration into a high-level hydrofluoric acid.

Accordingly, it is an object of the present invention to provide a wafer treating solution having the following features. Specifically, when in cleaning or etching the surfaces of wafer, a specific surfactant is contained in a high concentration of HF, $H_2O_2$, $HNO_3$, $CH_3COOH$, $NH_4F$, HCl, $H_3PO_4$, or an ammonium hydroxide represented by a formula: $[(R_1)(R_2)(R_3)(R_4)N]^+OH^-$ ($R_1$, $R_2$, $R_3$ and $R_4$ are an alkyl group having 1 to 6 carbon atoms which may have a hydroxyl group as a substituent), the wafer treating solution is excellent in solubility without causing severe foaming, has high storage and transport efficiencies, and exhibits an excellent action of preventing the contamination of the surfaces of wafers with fine particles when the solution is diluted at the time of use.

It is another object of the present invention to provide a wafer treating solution that exhibits an excellent action of preventing the contamination of the surfaces of silicon wafers with fine particles, in cleaning or etching the surfaces of the wafers.

DISCLOSURE OF THE INVENTION

The present invention provides a wafer treating solution in which at least one of $C_nH_{2n+1}ph(SO_3M)Oph(SO_3M)$ wherein ph is a phenylene group, n is 5 to 20, and M is a hydrogen or salt; $C_nH_{2n+1}phO(CH_2CH_2O)mSO_3M$ wherein ph is a phenylene group, n is 5 to 20, m is 0 to 20, and M is a hydrogen or salt; and $C_nH_{2n+1}O(CH_2CH_2O)mSO_3M$ wherein n is 5 to 20, m is 0 to 20, and M is a hydrogen or salt, is dissolved in 0.1 to 1000 ppm into a 20 to 60 wt % of hydrogen fluoride (HF), and the remainder is water (100 wt % in total), and a method for preparing a low concentration of wafer treating solution by adding water, $H_2O_2$, $HNO_3$, $CH_3COOH$, $NH_4F$ or the like, into the above solution.

The present invention also provides a wafer treating solution in which at least one of surfactants represented by $C_nH_{2n+1}ph(SO_3M)Oph(SO_3M)$ wherein ph is a phenylene group, n is 5 to 20, and M is a hydrogen or salt; $C_nH_{2n+1}phO(CH_2CH_2O)mSO_3M$ wherein ph is a phenylene group, n is 5 to 20, m is 0 to 20, and M is a hydrogen or salt; and $C_nH_{2n+1}O(CH_2CH_2O)mSO_3M$ wherein n is 5 to 20, m is 0 to 20, and M is a hydrogen or salt, is dissolved in 0.01 to 1000 ppm in at least one of HF, $H_2O_2$, $HNO_3$, $CH_3COOH$, $NH_4F$, HCl, $H_3PO_4$ and an ammonium hydroxide represented by a formula:

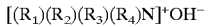

wherein $R_1$, $R_2$, $R_3$ and $R_4$ are an alkyl group of 1 to 6 carbon atoms which may have a hydroxyl group as a substitutent, and the remainder is water (100 wt % in total).

According to the present invention, it is possible to obtain a cleaning or etching solution, such as a hydrogen fluoride aqueous solution (HF—$H_2O$), a hydrofluoric acid-hydrogen peroxide aqueous solution (HF—$H_2O_2$—$H_2O$), a hydrofluoric-nitric acid aqueous solution (HF—$HNO_3$—$H_2O$), a hydrofluoric-nitric acid-acetic acid aqueous solution (HF—$HNO_3$—$CH_3COOH$—$H_2O$), a buffered hydrofluoric acid aqueous solution (HF—$NH_4F$—$H_2O$), a hydrochloric acid-hydrogen peroxide aqueous solution (HCl—$H_2O_2$—

$H_2O$), a phosphoric acid aqueous solution ($H_3PO_4$—$H_2O$), and an ammonium hydroxide-hydrogen peroxide aqueous solution ($[(R_1)(R_2)(R_3)(R_4)N]^+OH^-$—$H_2O_2$—$H_2O$), to each of which the above specific surfactant has been added.

According to the present invention, it is possible to obtain a wafer treating solution of high-concentration hydrogen fluoride aqueous solution (HF—$H_2O$) in which a specific surfactant has been contained. Even when the respective wafer treating solutions as described are prepared by adding water, $H_2O_2$, $HNO_3$, $CH_3COOH$, $NH_4F$ or the like, into this treating solution, the same effect can be obtained.

In the present invention, a wafer treating solution comprising a hydrofluoric acid aqueous solution containing the above surfactant preferably has a hydrofluoric acid concentration of 20 to 60 wt % and a surfactant concentration of 0.1 to 1000 ppm.

When the respective wafer treating solutions are prepared by adding water, $H_2O_2$, $HNO_3$, $CH_3COOH$, $NH_4F$ or the like, into the wafer treating solutions as described, they preferably have the following concentrations. Specifically, a hydrofluoric acid aqueous solution (HF—$H_2O$) has a hydrofluoric acid concentration of 0.1 to 5 wt %. A hydrofluoric acid-hydrogen peroxide aqueous solution (HF—$H_2O_2$—$H_2O$) has a hydrofluoric acid concentration of 0.1 to 10 wt % and a $H_2O_2$ concentration of 0.01 to 30 wt %. A hydrofluoric-nitric acid aqueous solution (HF—$HNO_3$—$H_2O$) has a hydrofluoric acid concentration of 0.1 to 50 wt % and a $HNO_3$ concentration of 0.1 to 70 wt %. A hydrofluoric-nitric acid-acetic acid aqueous solution (HF—$HNO_3$—$CH_3COOH$—$H_2O$) has a hydrofluoric acid concentration of 0.1 to 50 wt %, a $HNO_3$ concentration of 0.1 to 70 wt % and a $CH_3COOH$ concentration of 0.1 to 50 wt %. A buffered hydrofluoric acid aqueous solution (HF—$NH_4F$—$H_2O$) has a hydrofluoric acid concentration of 0.1 to 10 wt % and a $NH_4F$ concentration of 1 to 40 wt %. A hydrochloric acid-hydrogen peroxide aqueous solution (HCl—$H_2O_2$—$H_2O$) has a hydrochloric acid concentration of 0.1 to 36 wt % and a $H_2O_2$ concentration of 0.1 to 30 wt %. A phosphoric acid aqueous solution ($H_3PO_4$—$H_2O$) has a phosphoric acid concentration of 1 to 90 wt %. A quaternary ammonium salt-hydrogen peroxide aqueous solution ($[(R_1)(R_2)(R_3)(R_4)N]^+OH^-$—$H_2O_2$—$H_2O$) has an ammonium hydroxide concentration of 0.01 to 10 wt % and a $H_2O_2$ concentration of 0.01 to 30 wt %.

An ammonium hydroxide used in the present invention is represented by the following formula:

$$[(R_1)(R_2)(R_3)(R_4)N]^+OH^-$$

wherein $R_1$, $R_2$, $R_3$ and $R_4$ are each an alkyl group having 1 to 6 carbon atoms which may have a hydroxyl group as a substituent. Examples of alkyl group include methyl, ethyl, propyl, butyl and hexyl. Examples of concrete compound include $[HOCH_2CH_2N(CH_3)_3]^+OH^-$ (choline), $[(CH_3)_4N]^+OH^-$, and $[(C_2H_5)_4N]^+OH^-$.

Preferred surfactants used in the present invention are those which are represented by the formula: $C_nH_{2n+1}ph(SO_3M)Oph(SO_3M)$ wherein ph is a phenylene group, n is 5 to 20, and M is a hydrogen or salt; $C_nH_{2n+1}phO(CH_2CH_2O)mSO_3M$ wherein ph is a phenylene group, n is 5 to 20, m is 0 to 20, and M is a hydrogen or salt; and $C_nH_{2n+1}O(CH_2CH_2O)mSO_3M$ wherein n is 5 to 20, m is 0 to 20, and M is a hydrogen or salt. Examples of salt include sodium, potassium and like alkali metal salt, ammonium salt, primary, secondary or tertiary amine salt. Examples of amine include $CH_3NH_2$, $(CH_3)_2NH$ and $(CH_3)_3N$. Concrete examples thereof include $C_{12}H_{25}ph(SO_3H)Oph(SO_3H)$, $C_{12}H_{25}O(CH_2CH_2O)_2SO_3H$, $C_9H_{19}phO(CH_2CH_2O)_4SO_3H$, $C_{12}H_{25}O(CH_2CH_2O)_4SO_3Na$, $C_9H_{19}phO(CH_2CH_2O)_6SO_3H$, and their metal salts, ammonium salts, and a primary, secondary or tertiary amine salt. Each surfactant concentration is preferably 0.01 to 1000 ppm, more preferably 0.01 to 100 ppm.

BEST MODE OF CARRYING OUT THE INVENTION

The present invention will be described in detail with reference to examples and comparative examples.

EXAMPLES 1 TO 6 AND COMPARATIVE EXAMPLES 1 TO 5

4-in. Silicon wafers with a native oxide film were placed in a 0.5% HF aqueous solution, and polystyrene latex having the particle diameter of approximately 0.6 μm as a standard particle was added so that the number of fine particles was $10^5$ pieces/ml. The wafers were further dipped for 10 minutes into a treating solution that was prepared by adding various surfactants shown in Table 1. After being rinsed with ultrapure water and then dried, the number of fine particles adhered to the surfaces of the silicon wafers was measured on a laser surface scanner (Model LS-5000, Hitachi Denshi Engineering Co., Ltd.). Specifically, two silicon wafers were etched at a time and the number of fine particles adhered to the surfaces of the wafers was measured, to obtain the average value of the two wafers. The result is shown in Table 1.

TABLE 1

| | | 0.5% HF | | 50% HF | |
|---|---|---|---|---|---|
| surfactant | concn (ppm) | A* | B* | concn (ppm) | C* |
| Ex. 1 $C_{12}H_{25}ph(SO_3H)Oph(SO_3H)$ | 0.1 | 120 | o | 10 | o |
| Ex. 2 $C_{12}H_{25}ph(SO_3H)Oph(SO_3H)$ | 1 | 180 | o | 100 | o |
| Ex. 3 $C_{12}H_{25}ph(SO_3H)Oph(SO_3H)$ | 2 | 180 | o | 200 | o |
| Ex. 4 $C_{12}H_{25}O(CH_2CH_2O)_2SO_3Na$ | 1 | 210 | o | 100 | o |
| Ex. 5 $C_9H_{19}phO(CH_2CH_2O)_4SO_3Na$ | 1 | 110 | o | 100 | o |
| Ex. 6 $C_9H_{19}phO(CH_2CH_2O)_6SO_3NH_4$ | 1 | 230 | o | 100 | o |
| Com. Ex. 1 None | 0 | 6000 | — | 0 | — |
| Com. Ex. 2 $C_{12}H_{25}phSO_3Na$ | 1 | 1300 | o | 100 | o |
| Com. Ex. 3 $C_{12}H_{25}phSO_3Na$ | 200 | 72 | x | 20000 | x |
| Com. Ex. 4 $C_{12}H_{25}OSO_3Na$ | 1 | 4000 | o | 100 | o |
| Com. Ex. 5 $C_{12}H_{25}N(CH_2CH_2OH)_2$ | 1 | 6000 | o | 100 | o |

A*: number of particles adhered (pieces/wafer)
B*: defoamability
C*: solubility

EXAMPLES 7 TO 11 AND COMPARATIVE EXAMPLES 6 TO 9

4-in. Silicon wafers with a native oxide film were placed in a diluted hydrofluoric acid-hydrogen peroxide aqueous solution [HF(0.5%)—$H_2O_2$(10%)—$H_2O$], and polystyrene latex having the particle diameter of approximately 0.6 μm as a standard particle was added so that the number of fine particles was $10^5$ pieces/ml. The wafers were further dipped for 10 minutes into a treating solution that was prepared by adding various surfactants shown in Table 2. After being rinsed with ultrapure water and then dried, the number of fine particles adhered to the surfaces of the silicon wafers was measured on a laser surface scanner (Model LS-5000). Specifically, two silicon wafers were etched at a time and the number of fine particles adhered to the surfaces of the wafers was measured, to obtain the average value of the two wafers. The result is shown in Table 2.

TABLE 2

| | surfactant | HF(0.5%)-$H_2O_2$ (10%)-$H_2O$ | | | 50% HF | |
|---|---|---|---|---|---|---|
| | | concn (ppm) | A* | B* | concn (ppm) | C* |
| Ex. 7 | $C_{12}H_{25}$ph($SO_3$H)Oph($SO_3$H) | 0.5 | 840 | ○ | 50 | ○ |
| Ex. 8 | $C_{12}H_{25}$ph($SO_3$H)Oph($SO_3$H) | 1 | 660 | ○ | 100 | ○ |
| Ex. 9 | $C_{12}H_{25}$O($CH_2CH_2$O)$_2$$SO_3$Na | 1 | 830 | ○ | 100 | ○ |
| Ex. 10 | $C_9H_{19}$phO($CH_2CH_2$O)$_4$$SO_3$Na | 1 | 950 | ○ | 100 | ○ |
| Ex. 11 | $C_9H_{19}$phO($CH_2CH_2$O)$_6$$SO_3NH_4$ | 1 | 800 | ○ | 100 | ○ |
| Com. Ex. 6 | None | 0 | 2400 | — | 0 | — |
| Com. Ex. 7 | $C_{12}H_{25}$ph$SO_3$Na | 1 | 1900 | ○ | 100 | ○ |
| Com. Ex. 8 | $C_{12}H_{25}$O$SO_3$Na | 1 | 4500 | ○ | 100 | ○ |
| Com. Ex. 9 | $C_{12}H_{25}$N($CH_2CH_2$OH)$_2$ | 1 | >10000 | ○ | 100 | ○ |

EXAMPLES 12 TO 13 AND COMPARATIVE EXAMPLES 10 TO 13

4-in. Silicon wafers with a native oxide film were placed in a hydrofluoric-nitric acid aqueous solution [HF(1%)—$HNO_3$(5%)—$H_2O$], and polystyrene latex having the particle diameter of approximately 0.6 μm as a standard particle was added so that the number of fine particles was $10^5$ pieces/ml. The wafers were further dipped for 10 minutes into a treating solution that was prepared by adding various surfactants shown in Table 3. After being rinsed with ultrapure water and then dried, the number of fine particles adhered to the surfaces of the silicon wafers was measured on a laser surface scanner (Model LS-5000). Specifically, two silicon wafers were etched at a time and the number of fine particles adhered to the surfaces of the wafers was measured, to obtain the average value of the two wafers. The result is shown in Table 3.

TABLE 3

| | surfactant | HF(1%)-$HNO_3$ (5%)-$H_2O$ | | | 50% HF | |
|---|---|---|---|---|---|---|
| | | concn (ppm) | A* | B* | concn (ppm) | C* |
| Ex. 12 | $C_{12}H_{25}$ph($SO_3$H)Oph($SO_3$H) | 1 | 2800 | ○ | 100 | ○ |
| Ex. 13 | $C_9H_{19}$phO($CH_2CH_2$O)$_4$$SO_3$Na | 1 | 1900 | ○ | 100 | ○ |
| Com. Ex. 10 | None | 0 | 7800 | — | 0 | — |
| Com. Ex. 11 | $C_{12}H_{25}$ph$SO_3$Na | 1 | 8900 | ○ | 100 | ○ |
| Com. Ex. 12 | $C_{12}H_{25}$O$SO_3$Na | 1 | 6600 | ○ | 100 | ○ |
| Com. Ex. 13 | $C_{12}H_{25}$N($CH_2CH_2$OH)$_2$ | 1 | 6400 | ○ | 100 | ○ |

EXAMPLES 14 TO 17 AND COMPARATIVE EXAMPLES 14 TO 17

4-in. Silicon wafers with a native oxide film were placed in a buffered hydrofluoric acid aqueous solution [HF(6%)—$NH_4F$(30%)—$H_2O$], and polystyrene latex having the particle diameter of approximately 0.6 μm as a standard particle was added so that the number of fine particles was $10^5$ pieces/ml. The wafers were further dipped for 10 minutes into a treating solution that was prepared by adding various surfactants shown in Table 4. After being rinsed with ultrapure water and then dried, the number of fine particles adhered to the surfaces of the silicon wafers was measured on a laser surface scanner (Model LS-5000). Specifically, two silicon wafers were etched at a time and the number of fine particles adhered to the surfaces of the wafers was measured, to obtain the average value of the two wafers. The result is shown in Table 4.

TABLE 4

| | surfactant | HF(6%)-$NH_4F$ (30%)-$H_2O$ | | | 50% HF | |
|---|---|---|---|---|---|---|
| | | concn (ppm) | A* | B* | concn (ppm) | C* |
| Ex. 14 | $C_{12}H_{25}$ph($SO_3$H)Oph($SO_3$H) | 1 | 1300 | ○ | 8.3 | ○ |
| Ex. 15 | $C_{12}H_{25}$ph($SO_3$H)Oph($SO_3$H) | 10 | 1100 | ○ | 83 | ○ |
| Ex. 16 | $C_{12}H_{25}$O($CH_2CH_2$O)$_2$$SO_3NH_4$ | 20 | 1000 | ○ | 167 | ○ |
| Ex. 17 | $C_9H_{19}$phO($CH_2CH_2$O)$_4$$SO_3$Na | 10 | 600 | ○ | 83 | ○ |
| Com. Ex. 14 | None | 0 | 4000 | — | 0 | — |
| Com. Ex. 15 | $C_{12}H_{25}$ph$SO_3$Na | 1 | 3900 | ○ | 8.3 | ○ |
| Com. Ex. 16 | $C_{12}H_{25}$O$SO_3$Na | 1 | 4200 | ○ | 8.3 | ○ |
| Com. Ex. 17 | $C_{12}H_{25}$N($CH_2CH_2$OH)$_2$ | 1 | 5800 | ○ | 8.3 | ○ |

EXAMPLE 18 AND COMPARATIVE EXAMPLES 18 TO 21

4-in. Silicon wafers from which a native oxide film had been removed were placed in a hydrochloric acid-hydrogen peroxide aqueous solution [HCl(36%):$H_2O_2$(30%):$H_2O$= 1:1:6 (volume ratio)], and polystyrene latex having the particle diameter of approximately 0.6 μm as a standard particle was added so that the number of fine particles was $10^5$ pieces/ml. The wafers were further dipped for 10 minutes into a treating solution that was prepared by adding various surfactants shown in Table 4 and heated at 80° C. After being rinsed with ultrapure water→removed of native oxide film by 0.5% of HF→rinsed with ultrapure water→and then dried, the number of fine particles adhered to the surfaces of the silicon wafers was measured on a laser surface scanner (Model LS-5000). Specifically, two silicon wafers were etched at a time and the number of fine particles adhered to the surfaces of the wafers was measured, to obtain the average value of the two wafers. The result is shown in Table 5.

TABLE 5

| | surfactant | HCl (35%):$H_2O_2$(30%): $H_2O$ = 1:1:6(volume ratio) | | |
|---|---|---|---|---|
| | | concn (ppm) | A* | B* |
| Ex. 18 | $C_{12}H_{25}$ph($SO_3$H)Oph($SO_3$H) | 1 | 710 | ○ |
| Com. Ex. 18 | None | 0 | 4100 | — |

TABLE 5-continued

| | | HCl (35%):$H_2O_2$(30%): $H_2O$ = 1:1:6(volume ratio) | |
|---|---|---|---|
| surfactant | concn (ppm) | A* | B* |
| Com. Ex. 19 $C_{12}H_{25}$phSO$_3$Na | 1 | 8900 | ○ |
| Com. Ex. 20 $C_{12}H_{25}$OSO$_3$Na | 1 | >10000 | ○ |
| Com. Ex. 21 $C_{12}H_{25}$N(CH$_2$CH$_2$OH)2 | 1 | >10000 | ○ |

EXAMPLE 19 AND COMPARATIVE EXAMPLES 22 TO 25

5-in. Silicon wafers with $Si_3N_4$ film having a thickness of 100 nm were placed in a 85 wt % $H_3PO_4$ solution, and polystyrene latex having the particle diameter of approximately 0.6 μm as a standard particle was added so that the number of fine particles was $10^5$ pieces/ml. The wafers were further dipped for 10 minutes into a treating solution that was prepared by adding various surfactants shown in Table 6 and heated at 150° C. After being rinsed with ultrapure water and then dried, the number of fine particles adhered to the surfaces of the silicon wafers was measured on a laser surface scanner (Model LS-5000). Specifically, two silicon wafers were etched at a time and the number of fine particles adhered to the surfaces of the wafers was measured, to obtain the average value of the two wafers. The result is shown in Table 6.

TABLE 6

| | | 85% $H_3PO_4$(150° C.) | |
|---|---|---|---|
| surfactant | concn (ppm) | A* | B* |
| Ex. 19 $C_{12}H_{25}$ph(SO$_3$H)Oph(SO$_3$H) | 1 | 3200 | ○ |
| Com. Ex. 22 None | 0 | 8000 | — |
| Com. Ex. 23 $C_{12}H_{25}$phSO$_3$Na | 1 | >10000 | ○ |
| Com. Ex. 24 $C_{12}H_{25}$OSO$_3$Na | 1 | >10000 | ○ |
| Com. Ex. 25 $C_{12}H_{25}$N(CH$_2$CH$_2$OH)$_2$ | 1 | >10000 | ○ |

EXAMPLES 20 TO 25 AND COMPARATIVE EXAMPLES 26 TO 29

(A) 4-in. silicon wafers from which a native oxide film had been removed, or (B) 4-in. wafers with a thermal oxidation film, were separately placed in a choline-hydrogen peroxide solution [[HOCH$_2$CH$_2$N(CH$_3$)$_3$]$^+$OH$^-$ (0.1%)—$H_2O_2$(2%)—$H_2O$] (60~70° C.), and polystyrene latex having the particle diameter of approximately 0.6 μm as a standard particle was added so that the number of fine particles was $10^5$ pieces/ml. The wafers were further dipped for 10 minutes into a treating solution that was prepared by adding various surfactants shown in Table 7. After being rinsed with ultrapure water and then dried, the number of fine particles adhered to the surfaces of the silicon wafers was measured on the laser surface scanner (Model LS-5000). Specifically, three silicon wafers of the type (A) or (B) were etched at a time and the number of fine particles adhered to the surfaces of the wafers was measured, to obtain the average value of the three wafers. The result is shown in Table 7.

TABLE 7

| surfactant | concn (ppm) | wafer surface | A* | B* |
|---|---|---|---|---|
| Ex. 20 $C_{12}H_{25}$ph(SO$_3$H)Oph(SO$_3$H) | 1 | Si | 100 | ○ |
| Ex. 21 $C_{12}H_{25}$ph(SO$_3$H)Oph(SO$_3$H) | 5 | Si | 35 | ○ |
| Ex. 22 $C_{12}H_{25}$ph(SO$_3$H)Oph(SO$_3$H) | 10 | Si | 7 | ○ |
| Ex. 23 $C_{12}H_{25}$ph(SO$_3$H)Oph(SO$_3$H) | 1 | D* | 0 | ○ |
| Ex. 24 $C_{12}H_{25}$ph(SO$_3$H)Oph(SO$_3$H) | 5 | D* | 0 | ○ |
| Ex. 25 $C_{12}H_{25}$ph(SO$_3$H)Oph(SO$_3$H) | 10 | D* | 0 | ○ |
| Com. Ex. 26 None | 0 | Si | 210 | — |
| Com. Ex. 27 None | 0 | D* | 19 | — |
| Com. Ex. 28 $C_{12}H_{25}$N(CH$_2$CH$_2$OH)$_2$ | 300 | Si | 6900 | x |
| Com. Ex. 29 $C_{12}H_{25}$N(CH$_2$CH$_2$OH)$_2$ | 300 | D* | 2000 | x |

D*: thermal oxidation film

Industrial Applicability

The wafer treating solutions of the present invention can comply with the refinement and large-scale integration of semiconductor devices and are also extremely effective in performing a cleaning or etching by wet process. The treating solutions of the invention are excellent in solubility without causing severe foaming even if a specific surfactant is contained in a high concentration of hydrofluoric acid, have high storage and transport efficiencies, and exhibit superior action of preventing the contamination of the surfaces of wafers with fine particles even if their concentrations are lowered by dilution at the time of use. In addition, the number of fine particles adhered to the surfaces of wafers can be reduced by using the treating solution of the invention, leading to an improved yield.

What is claimed is:

1. A method for preparing a wafer treating solution comprising:

adding water to a stock solution comprising at least one surfactant selected from the group consisting of $C_nH_{2n+1}$ph(SO$_3$H)Oph(SO$_3$H) or a salt thereof, $C_nH_{2n+1}$phO(CH$_2$CH$_2$O)$_m$SO$_3$H or a salt thereof, and $C_nH_{2n+1}$O(CH$_2$CH$_2$O)$_m$SO$_3$H or a salt thereof, wherein ph is a phenylene group, n is 5 to 20, m is 0 to 20, dissolved in a stock aqueous solution of 20 to 60 wt % hydrogen fluoride (hydrogen fluoride and water total 100 wt % in said stock aqueous solution), wherein the concentration of said at least one surfactant in said wafer treating solution is 0.1 to 1000 ppm, to obtain said wafer treating solution, wherein said wafer treating solution comprises at least one surfactant selected from the group consisting of $C_nH_{2n+1}$ph(SO$_3$H)Oph(SO$_3$H) or a salt thereof, $C_nH_{2n+1}$phO(CH$_2$CH$_2$O)$_m$SO$_3$H or a salt thereof, and $C_nH_{2n+1}$O(CH$_2$CH$_2$O)$_m$SO$_3$H or a salt thereof, wherein ph is a phenylene group, n is 5 to 20, m is 0 to 20, dissolved in an aqueous solution of 0.1 to 5 wt % hydrogen fluoride (hydrogen fluoride and water total 100 wt % in said aqueous solution), wherein the concentration of said at least one surfactant in said wafer treating solution is 0.01 to 100 ppm, wherein said at least one surfactant in said stock solution is the same as said at least one surfactant in said wafer treating solution.

2. A method for preparing a wafer treating solution comprising:

adding water $H_2O_2$ to a stock solution comprising at least one surfactant selected from the group consisting of $C_nH_{2n+1}$ph(SO$_3$H)Oph(SO$_3$H) or a salt thereof, $C_nH_{2n+1}$phO(CH$_2$CH$_2$O)$_m$SO$_3$H or a salt thereof, $C_nH_{2n+1}$O(CH$_2$CH$_2$O)$_m$SO$_3$H or a salt thereof, wherein ph is a phenylene group, n is 5 to 20, m is 0 to 20, dissolved in a stock aqueous solution of 20 to 60 wt % hydrogen fluoride (hydrogen fluoride and water total 100 wt % in said stock aqueous solution), wherein the concentration of said at least one surfactant in said wafer treating solution is 0.1 to 1000 ppm, to obtain said wafer treating solution, wherein said wafer treating solution comprises at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO3H$ or a salt thereof, wherein ph is a phenylene group, n is 5 to 20, m is 0 to 20, dissolved in an aqueous solution of 0.1 to 10 wt % hydrogen fluoride and 0.01 to 30 wt % $H_2O_2$ (hydrogen fluoride, $H_2O_2$, and water total 100 wt % in said aqueous solution), wherein the concentration of said at least one surfactant in said wafer treating solution is 0.01 to 100 ppm, wherein said at least one surfactant in said stock solution is the same as said at least one surfactant in said wafer treating solution.

3. A method for preparing a wafer treating solution comprising:

adding water and $HNO_3$ to a stock solution comprising at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO_3H$ or a salt thereof, wherein ph is a phenylene group, n is 5 to 20, m is 0 to 20, dissolved in a stock aqueous solution of 20 to 60 wt % hydrogen fluoride (hydrogen fluoride and water total 100 wt % in said stock aqueous solution), wherein the concentration of said at least one surfactant in said wafer treating solution is 0.1 to 1000 ppm, to obtain said wafer treating solution, wherein said wafer treating solution comprises at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO_3H$ or a salt thereof, wherein ph is a phenylene group, n is 5 to 20, m is 0 to 20, dissolved in an aqueous solution of 0.1 to 50 wt % hydrogen fluoride and 0.1 to 70 wt % $HNO_3$ (hydrogen fluoride, $HNO_3$, and water total 100 wt % in said aqueous solution), wherein the concentration of said at least one surfactant in said wafer treating solution is 0.01 to 100 ppm, wherein said at least one surfactant in said stock solution is the same as said at least one surfactant in said wafer treating solution.

4. A method for preparing a wafer treating solution according to claim 3, further comprising adding $CH_3COOH$ in an amount of 0.1 to 50 wt % to the wafer treating solution prepared by the method of claim 3.

5. A method for preparing a wafer treating solution comprising:

adding water and $NH_4F$ to a stock solution comprising at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO_3H$ or a salt thereof, wherein ph is a phenylene group, n is 5 to 20, m is 0 to 20, dissolved in a stock aqueous solution of 20 to 60 wt % hydrogen fluoride (hydrogen fluoride and water total 100 wt % in said stock aqueous solution), wherein the concentration of said at least one surfactant in said wafer treating solution is 0.1 to 1000 ppm, to obtain said wafer treating solution, wherein said wafer treating solution comprises at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO_3H$ or a salt thereof, wherein ph is a phenylene group, n is 5 to 20, m is 0 to 20, dissolved in an aqueous solution of 0.1 to 10 wt % hydrogen fluoride and 1 to 40 wt % $NH_4F$ (hydrogen fluoride, $NH_4F$, and water total 100 wt % in said aqueous solution), wherein the concentration of said at least one surfactant in said wafer treating solution is 0.01 to 100 ppm, wherein said at least one surfactant in said stock solution is the same as said at least one surfactant in said wafer treating solution.

6. A wafer treating solution prepared by a method comprising: dissolving a stock solution comprising at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO_3H$ or a salt thereof, wherein ph is a phenylene group, n is 5 to 20, and m is 0 to 20, in an aqueous solution of 0.1 to 5 wt % hydrogen fluoride, wherein hydrogen fluoride and water total 100 wt % in said aqueous solution, to obtain said wafer treating solution comprising said at least one surfactant at 0.01 to 1000 ppm.

7. A wafer treating solution prepared by a method comprising: dissolving a stock solution comprising at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO_3H$ or a salt thereof, wherein ph is a phenylene group, n is 5 to 20, and m is 0 to 20, in an aqueous solution of 0.1 to 10 wt % hydrogen fluoride and 0.01 to 30 wt % $H_2O_2$, wherein hydrogen fluoride, $H_2O_2$ and water total 100 wt % in said aqueous solution, to obtain said wafer treating solution comprising said at least one surfactant at 0.01 to 1000 ppm.

8. A wafer treating solution prepared by a method comprising: dissolving a stock solution comprising at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO_3H$ or a salt thereof, wherein ph is a phenylene group, n is 5 to 20, and m is 0 to 20, in an aqueous solution of 0.1 to 50 wt % hydrogen fluoride and 0.1 to 70 wt % $HNO_3$, wherein hydrogen fluoride, $HNO_3$ and water total 100 wt % in said aqueous solution, to obtain said wafer treating solution comprising said at least one surfactant at 0.01 to 1000 ppm.

9. A wafer treating solution as defined in claim 8, further comprising 0.1 to 50 wt % $CH_3COOH$.

10. A wafer treating solution prepared by a method comprising: dissolving a stock solution comprising at least one surfactant selected from the group consisting of
$C_nH_{2n+1}ph(SO_3H)Oph(SO_3H)$ or a salt thereof,
$C_nH_{2n+1}phO(CH_2CH_2O)_mSO_3H$ or a salt thereof, and
$C_nH_{2n+1}O(CH_2CH_2O)_mSO_3H$ or a salt thereof, wherein ph is a phenylene group, n is 5 to 20, and m is 0 to 20, in an aqueous solution of 0.1 to 10 wt % hydrogen fluoride and 1 to 40 wt % NH$_4$F, wherein hydrogen fluoride, NH$_4$F and water total 100 wt % in said aqueous solution, to obtain said wafer treating solution comprising said at least one surfactant at 0.01 to 1000 ppm.

11. A wafer treating solution prepared by a method comprising: dissolving a stock solution comprising at least one surfactant selected from the group consisting of C$_n$H$_{2n+1}$ph(SO$_3$H)Oph(SO$_3$H) or a salt thereof, C$_n$H$_{2n+1}$phO(CH$_2$CH$_2$O)$_m$SO$_3$H or a salt thereof, and C$_n$H$_{2n+1}$O(CH$_2$CH$_2$O)$_m$SO$_3$H or a salt thereof, wherein ph is a phenylene group, n is 5 to 20, and m is 0 to 20, in an aqueous solution of 0.1 to 36 wt % HCl and 0.1 to 30 wt % H$_2$O$_2$, wherein HCl, H$_2$O$_2$ and water total 100 wt % in said aqueous solution, to obtain said wafer treating solution comprising said at least one surfactant at 0.01 to 1000 ppm.

12. A wafer treating solution prepared by a method comprising: dissolving a stock solution comprising at least one surfactant selected from the group consisting of C$_n$H$_{2n+1}$ph(SO$_3$H)Oph(SO$_3$H) or a salt thereof, C$_n$H$_{2n+1}$phO(CH$_2$CH$_2$O)$_m$SO$_3$H or a salt thereof, and C$_n$H$_{2n+1}$O(CH$_2$CH$_2$O)$_m$SO$_3$H or a salt thereof, wherein ph is a phenylene group, n is 5 to 20, and m is 0 to 20, in an aqueous solution of 1 to 90 wt % H$_3$PO$_4$, wherein H$_3$PO$_4$ and water total 100 wt % in said aqueous solution, to obtain said wafer treating solution comprising said at least one surfactant at 0.01 to 1000 ppm.

13. A wafer treating solution prepared by a method comprising: dissolving a stock solution comprising at least one surfactant selected from the group consisting of C$_n$H$_{2n+1}$ph(SO$_3$H)Oph(SO$_3$H) or a salt thereof, C$_n$H$_{2n+1}$phO(CH$_2$CH$_2$O)$_m$SO$_3$H or a salt thereof, and C$_n$H$_{2n+1}$O(CH$_2$CH$_2$O)$_m$SO$_3$H or a salt thereof, wherein ph is a phenylene group, n is 5 to 20, and m is 0 to 20, in an aqueous solution of (1) 0.01 to 10 wt % of an ammonium hydroxide represented by a formula:

$[(R_1)(R_2)(R_3)(R_4)N]^+OH^-$, wherein R$_1$, R$_2$, R$_3$ and R$_4$ are independently an alkyl group of 1 to 6 carbon atoms optionally substituted by a hydroxy group, and (2) 0.01 to 30 wt % H$_2$O$_2$, wherein the ammonium hydroxide, H$_2$O$_2$ and water total 100 wt % in said aqueous solution, to obtain said wafer treating solution comprising said at least one surfactant at 0.01 to 1000 ppm.

14. A wafer treating solution prepared by a method comprising: dissolving a stock solution comprising at least one surfactant selected from the group consisting of C$_n$H$_{2n+1}$ph(SO$_3$H)Oph(SO$_3$H) or a salt thereof, C$_n$H$_{2n+1}$phO(CH$_2$CH$_2$O)$_m$SO$_3$H or a salt thereof, and C$_n$H$_{2n+1}$O(CH$_2$CH$_2$O)$_m$SO$_3$H or a salt thereof, wherein ph is a phenylene group, n is 5 to 20, and m is 0 to 20, in an aqueous solution comprising at least one of H$_2$O$_2$, HNO$_3$, CH$_3$COOH, NH$_4$F, HCl and an ammonium hydroxide, wherein said ammonium hydroxide is represented by a formula:

$[(R_1)(R_2)(R_3)(R_4)N]^+OH^-$, wherein R$_1$, R$_2$, R$_3$ and R$_4$ are independently an alkyl group of 1 to 6 carbon atoms optionally substituted by a hydroxy group, to obtain said wafer treating solution comprising said at least one surfactant at 0.01 to 1000 ppm.

* * * * *